(12) United States Patent
Mao et al.

(10) Patent No.: US 7,064,934 B2
(45) Date of Patent: Jun. 20, 2006

(54) MAGNETORESISTIVE SENSOR WITH REDUCED OPERATING TEMPERATURE

(75) Inventors: Sining Mao, Savage, MN (US); William P. Vavra, Maple Plain, MN (US); Eric S. Linville, Chanhassan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 100 days.

(21) Appl. No.: 10/459,820

(22) Filed: Jun. 12, 2003

(65) Prior Publication Data

US 2004/0252414 A1 Dec. 16, 2004

(51) Int. Cl.
*G11B 5/39* (2006.01)

(52) U.S. Cl. .................................... 360/313
(58) Field of Classification Search ............... 360/313, 360/314, 319–320, 322, 324.2
See application file for complete search history.

(56) References Cited

U.S. PATENT DOCUMENTS

| 6,031,372 | A | 2/2000 | Van Den Berg |
| 6,178,074 | B1 * | 1/2001 | Gill ..................... 360/324.2 |
| 6,275,363 | B1 * | 8/2001 | Gill ..................... 360/324.2 |
| 6,455,177 | B1 * | 9/2002 | Everitt et al. ............ 428/693 |
| 6,473,279 | B1 | 10/2002 | Smith et al. |
| 6,724,587 | B1 * | 4/2004 | Gill ..................... 360/324.2 |
| 6,750,068 | B1 * | 6/2004 | Chen ....................... 438/3 |
| 6,765,768 | B1 * | 7/2004 | Saito ..................... 360/319 |
| 6,873,501 | B1 * | 3/2005 | Zheng et al. ........ 360/324.12 |
| 6,896,974 | B1 * | 5/2005 | Saito ..................... 428/636 |
| 6,903,396 | B1 * | 6/2005 | Tuttle ..................... 257/295 |
| 6,905,780 | B1 * | 6/2005 | Yuasa et al. ............. 428/611 |
| 2002/0135955 | A1 | 9/2002 | Ono et al. |
| 2002/0141119 | A1 | 10/2002 | Saito |
| 2004/0233584 | A1 * | 11/2004 | Liu et al. ................. 360/313 |

\* cited by examiner

*Primary Examiner*—Angel Castro
(74) *Attorney, Agent, or Firm*—Kinney & Lange, P.A.

(57) ABSTRACT

A magnetoresistive (MR) sensor having reduced operating temperature is disclosed. The MR sensor, which includes an MR stack having a magnetoresistive layer, is configured to operate in a current-perpendicular-to-plane (CPP) mode wherein a sense current flows substantially perpendicular to a longitudinal plane of the magnetoresistive layer. The MR sensor further includes a thermal sink layer positioned with respect to the MR stack to reduce an operating temperature of the magnetoresistive sensor. The thermal sink layer is made of a material having high thermal conductivity, and is preferably separated from the MR stack by a metallic cap or seed layer.

33 Claims, 7 Drawing Sheets

MAGNETORESISTIVE SENSOR WITH REDUCED OPERATING TEMPERATURE

BACKGROUND OF THE INVENTION

The present invention relates generally to a magnetoresistive sensor for use in a magnetic read head. More particularly, the present invention relates to current-perpendicular-to-plane (CPP) magnetoresistive (MR) read sensors having a reduced operating temperature.

Magnetoresistive read sensors, such as giant magnetoresistive (GMR) read sensors, are used in magnetic data storage systems to detect magnetically-encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. Depending on the geometry of the device, the sense current may be passed in the plane (CIP) of the layers of the device or perpendicular to the plane (CPP) of the layers of the device. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a synthetic antiferromagnet (SAF) and a ferromagnetic free layer, or between two ferromagnetic free layers. In the former case, the magnetization of the SAF is fixed, typically normal to an air bearing surface (ABS) of the GMR read sensor, while the magnetization of the free layer rotates freely in response to an external magnetic field. The SAF includes a reference layer and a pinned layer which are magnetically coupled by a coupling layer such that the magnetization direction of the reference layer is opposite to the magnetization of the pinned layer. In the latter case, the magnetizations of the two free layers rotate freely in response to an external magnetic field. The resistance of the GMR read sensor varies as a function of an angle formed between the magnetization direction of the free layer and the magnetization direction of the reference layer of the SAF, or as a function of an angle formed between the magnetization directions of the two free layers. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A TMR read sensor is similar in structure to a CPP GMR spin valve, but the physics of the device are different. For a TMR read sensor, rather than using a spacer layer, a barrier layer is positioned between the free layer and the SAF or between two free layers. Electrons must tunnel through the barrier layer. A sense current flowing perpendicularly to the plane of the layers of the TMR read sensor experiences a resistance which is proportional to the cosine of an angle formed between the magnetization direction of the free layer and the magnetization direction of the reference layer of the SAF, or between the two free layers.

A pinning layer is typically exchange coupled to the pinned layer of the SAF to fix the magnetization of the pinned layer in a predetermined direction. The pinning layer is typically formed of an antiferromagnetic material. In antiferromagnetic materials, the magnetic moments of adjacent atomic planes are aligned in alternating directions and, thus, there is no net magnetic moment in the material.

An underlayer is typically used to promote the texture of the pinning layer consequently grown on top of it. The underlayer is typically formed of a ferromagnetic material and is chosen such that its atomic structure, or arrangement, corresponds with a desired crystallographic direction.

A seed layer is typically used to enhance the grain growth of the underlayer consequently grown on top of it. In particular, the seed layer provides a desired grain structure and size.

As magnetic storage and retrieval systems have developed greater capacities, greater areal bit densities have been employed. Smaller areal bit sizes have corresponded to the greater areal bit densities. Narrow reader widths are desired for retrieval of data stored on ultra-high density media having small areal size bits. As the width of the read gap decreases with increasing areal bit densities, higher demand is placed on the sensitivity of the magnetoresistive portion of the MR read sensor. One effect of a decreased read gap width is an increase in the amount of heat that is produced by the magnetoresistive element during operation. When a MR read sensor is subjected to increasing temperatures, the thin layers comprising the MR read sensor become less reliable and more susceptible to thermal breakdown due to electrical and thermal stresses. The degradation of the function of the MR read sensor is exponentially dependent on the operating temperature of the device.

Another issue facing MR read sensors are temperature spikes resulting from electrostatic discharge (ESD) or electric overstress (EOS) transient and thermal asperity events during operation. Magnetic heads possess an acute sensitivity to damage or failure from ESD or EOS events.

Maintaining a low operating temperature is essential for the continued proper operation of MR read sensors and for proper read/write head electrical performance. The present invention is directed to maintaining such low operating temperatures in CPP MR read sensors.

BRIEF SUMMARY OF THE INVENTION

The present invention is a magnetoresistive (MR) sensor having reduced operating temperature. The MR sensor, which includes an MR stack having a magnetoresistive layer, is configured to operate in a current-perpendicular-to-plane (CPP) mode wherein a sense current flows substantially perpendicular to a longitudinal plane of the magnetoresistive layer. The MR sensor further includes a thermal sink layer positioned with respect to the MR stack to reduce an operating temperature of the magnetoresistive sensor. The thermal sink layer is made of a material having high thermal conductivity, and is preferably separated from the MR stack by a metallic cap or seed layer.

DETAILED DESCRIPTION

Figure 1:
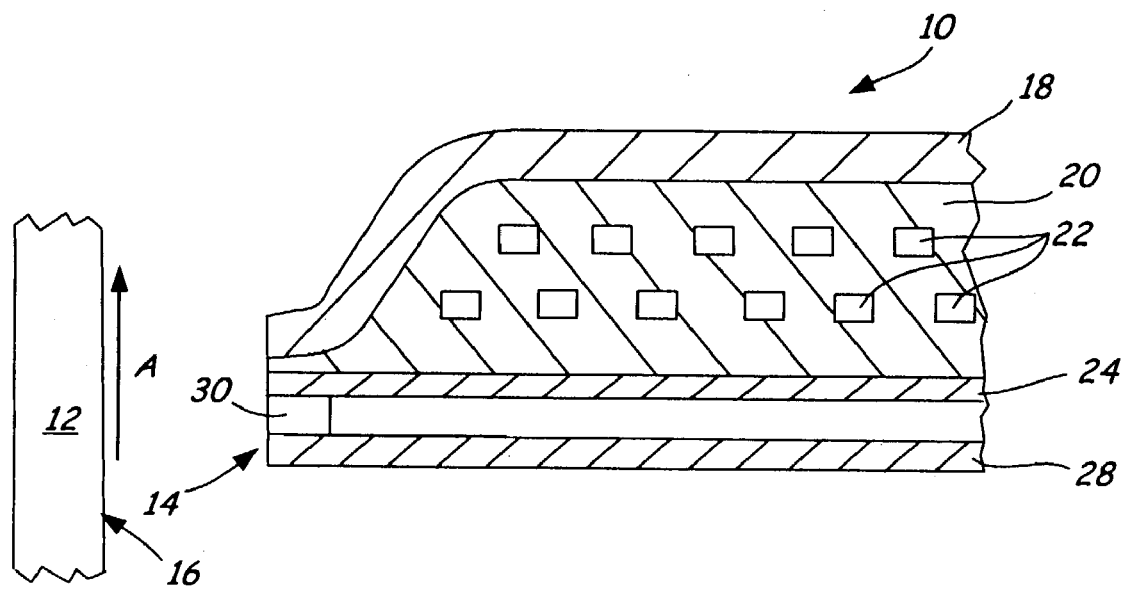
FIG. 1 is a cross-sectional view of a magnetic read/write head and magnetic disc taken along a plane normal to an air bearing surface of the read/write head.

FIG. 1 is a cross-sectional view of a magnetic read/write head 10 and magnetic disc 12 taken along a plane normal to air bearing surface 14 of read/write head 10. Air bearing surface 14 of magnetic read/write head 10 faces disc surface 16 of magnetic disc 12. Magnetic disc 12 travels or rotates in a direction relative to magnetic read/write head 10 as indicated by arrow A. Spacing between air bearing surface 14 and disc surface 16 is preferably minimized while avoiding contact between magnetic read/write head 10 and magnetic disc 12.

A writer portion of magnetic read/write head 10 includes top pole 18, insulator 20, conductive coils 22 and bottom pole/top shield 24. Conductive coils 22 are held in place between top pole 18 and top shield 24 by use of insulator 20. Conductive coils 22 are shown in FIG. 1 as two layers of coils but may also be formed of any number of layers of coils as is well known in the field of magnetic read/write head design.

A reader portion of magnetic read/write head 10 includes bottom pole/top shield 24, bottom shield 28, and magnetoresistive (MR) stack 30. MR stack 30 is positioned between terminating ends of bottom pole 24 and bottom shield 28. Bottom pole/top shield 24 functions both as a shield and as a shared pole for use in conjunction with top pole 18.

Figure 2:
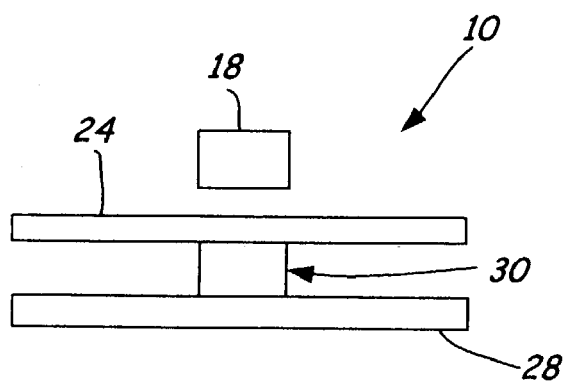
FIG. 2 is a layer diagram of an air bearing surface of the magnetic read/write head of FIG. 1.

FIG. 2 is a layer diagram of air bearing surface 14 of magnetic read/write head 10. FIG. 2 illustrates the location of magnetically significant elements in magnetic read/write head 10 as they appear along air bearing surface 14 of magnetic read/write head 10 of FIG. 1. In FIG. 2, all spacing and insulating layers of magnetic read/write head 10 are omitted for clarity. Bottom shield 28 and bottom pole/top shield 24 are spaced to provide for a location of MR stack 30. A sense current is caused to flow through MR stack 30 via bottom pole/top shield 24 and bottom shield 28. While the sense current is injected through the bottom pole/top shield 24 and bottom shield 28 in FIGS. 1 and 2, other configurations have MR stack 30 electrically isolated from bottom pole/top shield 24 and bottom shield 28, with additional leads providing the sense current to MR stack 30. As the sense current is passed through MR stack 30, the read sensor exhibits a resistive response, which results in a varied output voltage. Because the sense current flows perpendicular to the plane of MR stack 30, the reader portion of magnetic read/write head 10 is a current-perpendicular-to-plane (CPP) type device. Magnetic read/write head 10 is merely illustrative, and other CPP configurations may be used in accordance with the present invention.

Figure 3:
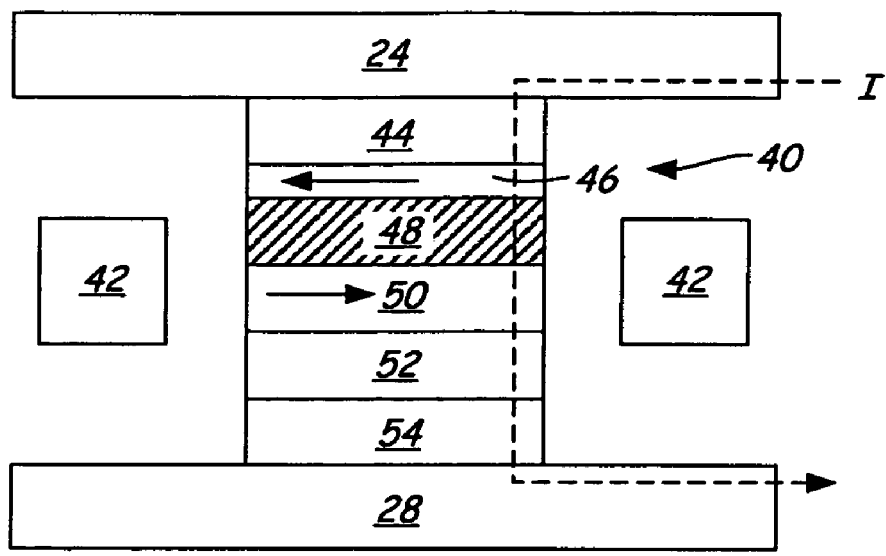
FIG. 3 shows an ABS view of conventional current-perpendicular-to-plane (CPP) magnetoresistive (MR) stack with permanent magnet hard bias layers.

FIG. 3 shows an ABS view of conventional current-perpendicular-to-plane (CPP) magnetoresistive (MR) stack 40 with permanent magnet hard bias layers 42. MR stack 40 includes metal cap layer 44, free layer 46, nonmagnetic layer 48, pinned layer 50, antiferromagnetic pinning layer 52, and metal seed layer 54. MR stack 40 is positioned between top shield 24 and bottom shield 28. Permanent magnet hard bias layers 42 function to bias free layer 46 and pinned layer 50, and to stabilize antiferromagnetic pinning layer 52.

Figure 4:
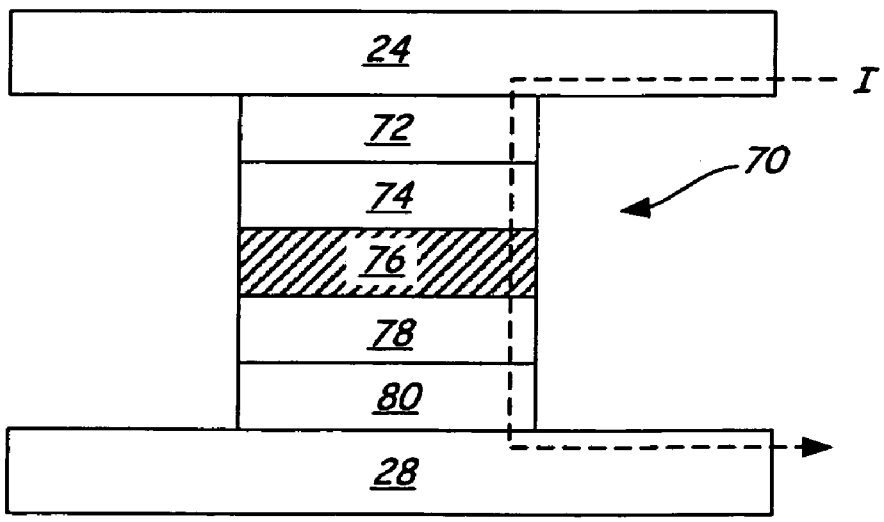
FIG. 4 shows an ABS view of conventional tri-layer CPP MR stack.

FIG. 4 shows an ABS view of a conventional tri-layer CPP MR stack 70. MR stack 70 includes metal cap layer 72, first free layer 74, nonmagnetic layer 76, second free layer 78, and metal seed layer 80. MR stack 70 is positioned between top shield 24 and bottom shield/lead 28.

For brevity, the operation of the conventional devices shown in FIGS. 3 and 4 will be described concurrently. In operation, sense current I is passed through CPP MR stacks 40 or 70, as shown in FIGS. 3 and 4. Sense current I flows perpendicularly to the plane of the layers of the MR read sensor and experiences a resistance which is proportional to the cosine of an angle formed between the magnetization direction of the free layer and the magnetization direction of the reference layer of the SAF (FIG. 3), or between the two free layers (FIG. 4). The voltage across the CPP MR stack is then measured to determine the change in resistance and the resulting signal is used to recover the encoded information from the magnetic medium.

As described above, narrow reader widths are desired for retrieval of data stored on ultra-high density media having small areal size bits. As the width of the read gap decreases with increasing areal bit densities, higher demand is placed on the sensitivity of the magnetoresistive portion of the MR read sensor. One effect of a decreased read gap width is an increase in the amount of heat that is produced by the magnetoresistive element during operation. This heat must be dissipated in some way to prevent the thin layers of the MR read sensor from becoming less reliable and more susceptible to thermal breakdown due to electrical and thermal stresses. The degradation of the function of the MR read sensor is exponentially dependent on the operating temperature of the device.

In conventional CPP MR stacks as shown in FIGS. 3 and 4, the cap layer and the seed layer are positioned on opposing ends of the MR stack. These layers separate the MR stack from the shield layers. These relatively thick layers are typically included in conventional designs to provide an appropriate shield-to-shield spacing for the read sensor and to protect the CPP MR stack. However, a material having low thermal conductivity, such as beta phase tantalum (Ta), is used for the cap and seed layers in conventional CPP MR stacks to satisfy processing requirements. Materials having low thermal conductivity do not provide sufficient heat dissipation for the MR stack, thus resulting in a less reliable read sensor that is more susceptible to thermal breakdown. Furthermore, temperature spikes resulting from electrostatic discharge (ESD) or electric overstress (EOS) transient and thermal asperity events are more likely to occur during operation when a layer with low thermal conductivity separates the MR stack from the electrical leads. Magnetic recording heads possess an acute sensitivity to damage or failure from ESD or EOS events.

Figure 5:
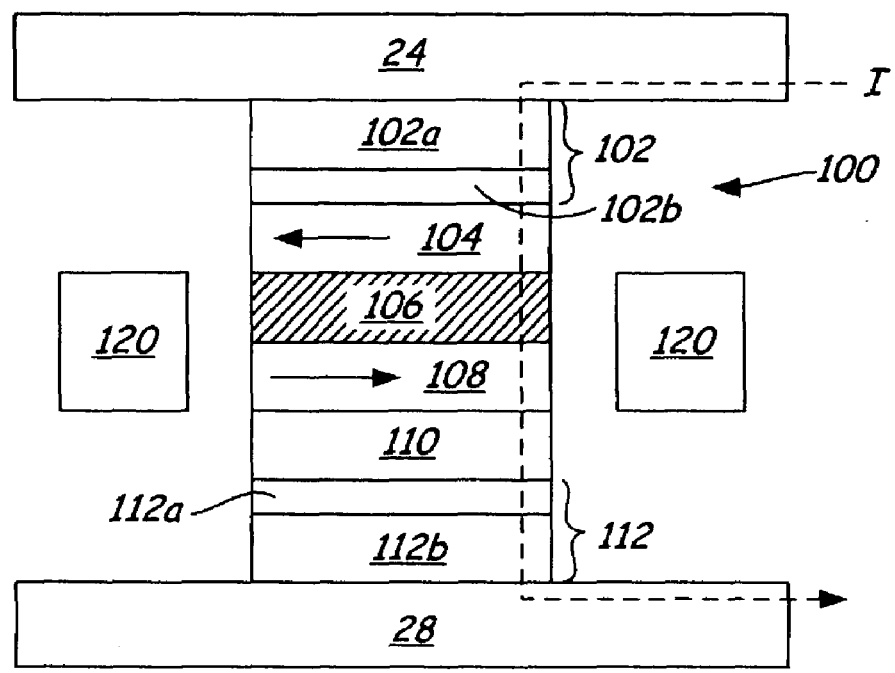
FIG. 5 shows an ABS view of a bottom pinned CPP MR stack having improved thermal conduction according to the present invention.

FIG. 5 shows an ABS view of a first bottom pinned CPP MR stack 100 having improved thermal conduction according to the present invention. Bottom pinned CPP MR stack 100 includes cap bilayer 102, free layer 104, nonmagnetic layer 106, pinned layer 108, antiferromagnetic pinning layer 110, and seed bilayer 112. Nonmagnetic layer 106 exhibits a magnetoresistive effect and maybe, for example, a tunnel barrier (for a tunneling magnetoresistive (TMR) device) or a nonmagnetic metal (for a giant magnetoresistive (GMR) device, such as a spin valve). Cap bilayer 102 includes thermal sink cap layer 102a and nonmagnetic metal cap layer 102b, and seed bilayer 112 includes nonmagnetic metal seed layer 112a and thermal sink seed layer 112b. MR stack 100 is positioned between top shield 24 and bottom shield 28. Permanent magnet hard bias layers 120 function to bias free layer 104 and pinned layer 108, and to stabilize antiferromagnetic pinning layer 110. Permanent magnet hard bias layers 120 are typically separated from CPP MR stack 100 by a non-magnetic insulating material (not shown). Nonmagnetic metal cap layer 102b and nonmagnetic metal seed layer 112a are typically included in cap bilayer 102 and seed bilayer 112, respectively, to provide an appropriate shield-to-shield spacing for the read sensor and to provide protection to CPP MR stack 100.

In operation, a sense current I is passed perpendicular to the longitudinal plane of CPP MR stack 100. Sense current I experiences a resistance which is proportional to the cosine of an angle formed between the magnetization direction of free layer 104 and the magnetization direction of pinned layer 108. As areal bit densities increase, higher demand is placed on the sensitivity of the magnetoresistive portion of CPP MR stack 100. This in turn results in an increase in the amount of heat that is produced by nonmagnetic layer 106 during operation due to Joule heating. The addition of thermal sink layers 102a and 112b, which are made of a material having high thermal conductivity (preferably greater than ~50 W/m° K), significantly dissipates this heat before it reaches the thermally sensitive layers in MR stack 100. The decreased temperature at the magnetoresistive element significantly improves the reliability and longevity of the read sensor.

Figure 6:
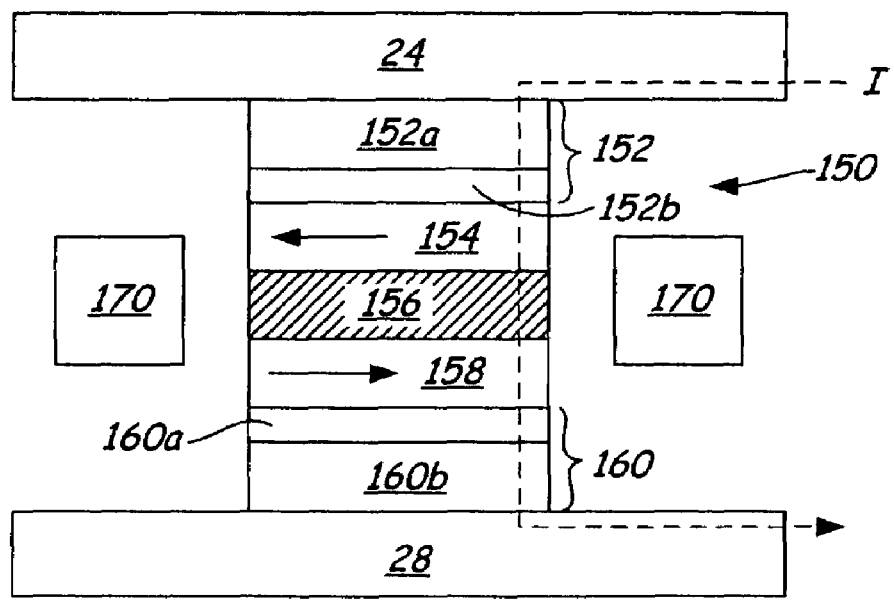
FIG. 6 shows an ABS view of another bottom pinned CPP MR stack having improved thermal conduction according to the present invention.

FIG. 6 shows an ABS view of a second bottom pinned CPP MR stack 150 having improved thermal conduction according to the present invention. CPP MR stack 150 includes cap bilayer 152, free layer 154, nonmagnetic layer 156, synthetic antiferromagnetic (SAF) pinned layer 158, and seed bilayer 160. Nonmagnetic layer 156 exhibits a magnetoresistive effect and may be, for example, a tunnel barrier (for a TMR device) or a nonmagnetic metal (for a GMR device). Cap bilayer 152 includes thermal sink cap layer 152a and nonmagnetic metal cap layer 152b, and seed bilayer 160 includes nonmagnetic metal seed layer 160a and thermal sink seed layer 160b. MR stack 150 is positioned between top shield 24 and bottom shield 28. Permanent magnet hard bias layers 170 function to bias free layer 154 and SAF pinned layer 158. Permanent magnet hard bias layers 170 are typically separated from CPP MR stack 150 by a non-magnetic insulating material (not shown). Nonmagnetic metal cap layer 152b and nonmagnetic metal seed layer 160a are typically included in cap bilayer 152 and seed bilayer 160, respectively, to provide an appropriate shield-to-shield spacing for the read sensor and to protect CPP MR stack 150.

The operation of CPP MR stack 150 is similar to the operation of CPP MR stack 100. A sense current I is passed perpendicular to the longitudinal plane of CPP MR stack 150. Sense current I experiences a resistance which is proportional to the cosine of an angle formed between the magnetization direction of free layer 154 and the magnetization direction of SAF pinned layer 158. As areal bit densities increase, higher demand is placed on the sensitivity of the magnetoresistive portion of the CPP MR stack 150. This in turn results in an increase in the amount of heat that is produced by nonmagnetic layer 156 during operation due to Joule heating. The addition of thermal sink layers 152a and 160b, which are made of a material having high thermal conductivity (preferably greater than ~50 W/m° K), significantly dissipates this heat before it reaches the thermally sensitive layers in MR stack 150. The decreased temperature at the magnetoresistive element significantly improves the reliability and longevity of the read sensor.

Figure 7:
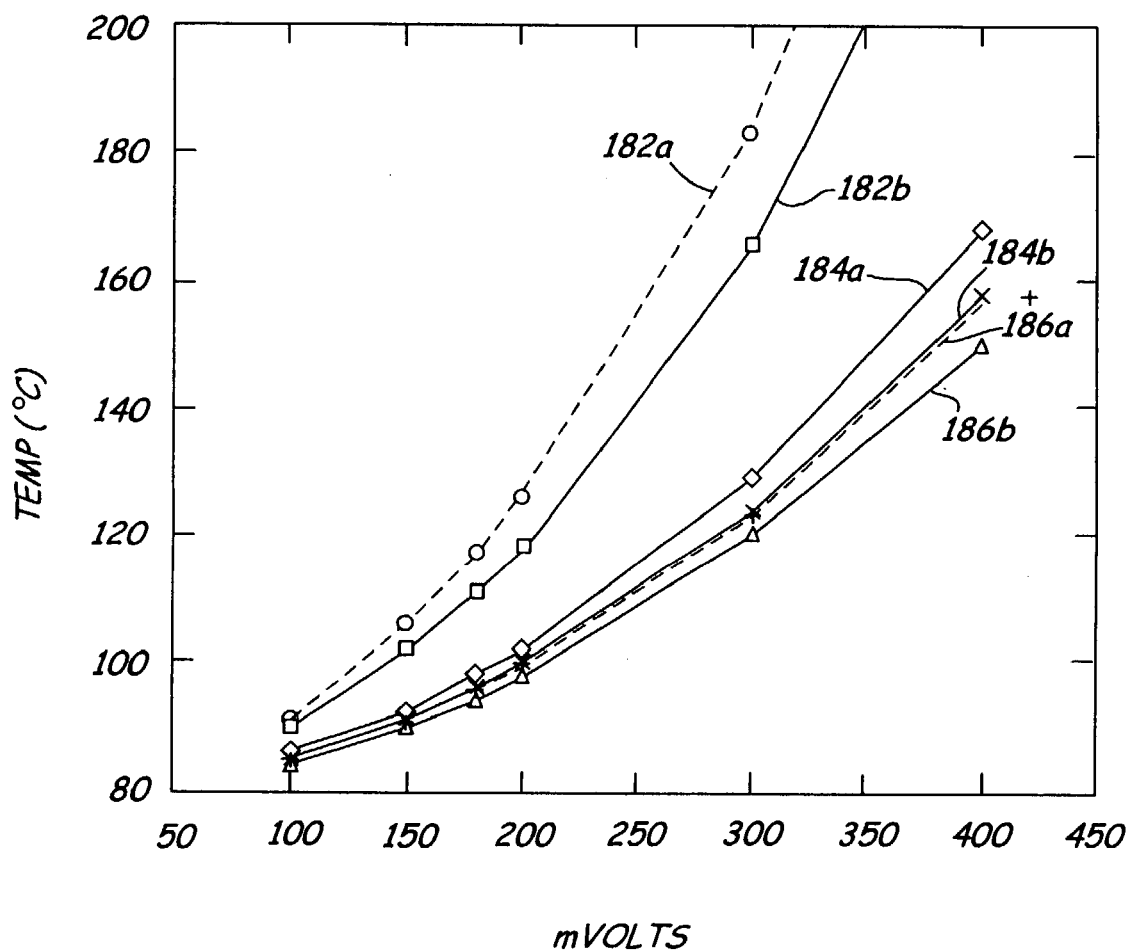
FIG. 7 is a line graph showing the operating temperature at various voltages of a bottom pinned CPP MR stack using different materials for the cap and seed layers.

In FIG. 7, line graph 180 shows the operating temperature at various voltages of a bottom pinned CPP MR stack using different materials for the cap and seed layers. Graph 180 shows the operating temperature in degrees Celsius (° C.) on the vertical axis and operating voltage in millivolts (mV) on the horizontal axis at an ambient temperature of 80° C. Graph 180 includes traces 182a, 182b, 184a, 184b, 186a, and 186b. Traces 182a and 182b show the peak and average operating temperatures, respectively, of a bottom pinned CPP head with a cap and seed layer made of beta phase tantalum (Ta), a material having a relatively low thermal conductivity (~5 W/m° K). Traces 182a and 182bare correlatable to the operating temperature rise of conventional bottom pinned CPP MR stack 40 shown in FIG. 3. As is shown, the operating temperature increases rapidly as the operating voltage of the device is increased. This rapid temperature rise can result in functional breakdown of the CPP MR stack.

Traces 184a and 184b show the peak and average operating temperatures, respectively, of a bottom pinned CPP head with a cap and seed layer including a layer of rhodium (Rh). Traces 186a and 186b show the peak and average operating temperatures, respectively, of a bottom pinned CPP head with a cap and seed layer including a layer of aluminum (Al). Both Rh and Al have relatively high thermal conductivities (Rh: 150 W/m° K; Al: 237 W/m° K). Traces 184a, 184b, 186a, and 186b are correlatable to the operating temperature rise of CPP MR stacks 100 and 150 of the present invention shown in FIGS. 5 and 6. As is shown, the operating temperature of the CPP MR stack is significantly reduced by incorporating a layer of high thermal conductivity material in the cap and seed layers of the CPP MR stack.

Figure 8:
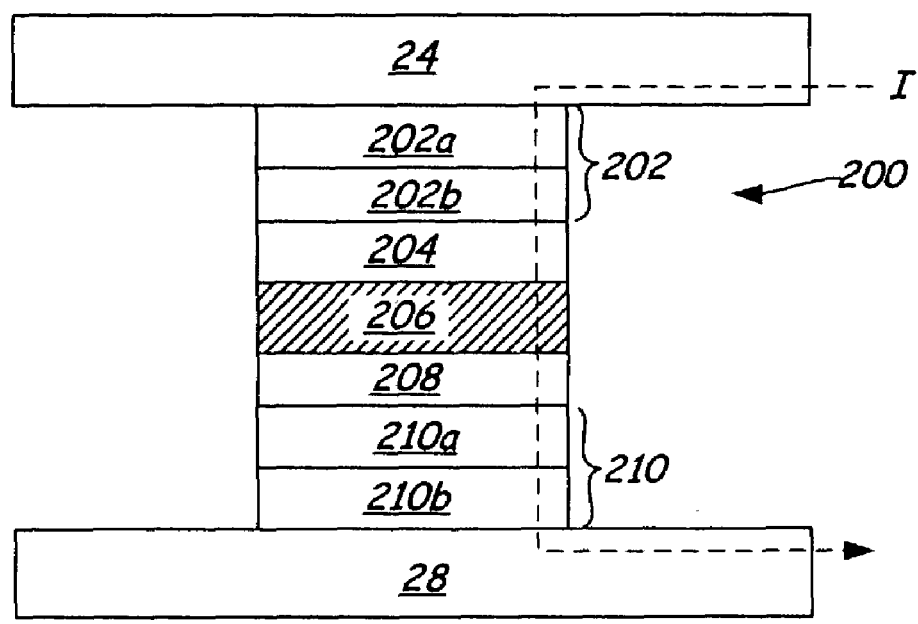
FIG. 8 shows an ABS view of a configuration for a tri-layer CPP MR stack having improved thermal conduction according to the present invention.

FIG. 8 shows and ABS view of a first configuration for tri-layer CPP MR stack 200 having improved thermal conduction according to the present invention. MR stack includes cap bilayer 202, first free layer 204, nonmagnetic layer 206, second free layer 208, and seed bilayer 210. Nonmagnetic layer 206 exhibits a magnetoresistive effect and may be, for example, a tunnel barrier (for a TMR device) or a nonmagnetic metal (for a GMR device). Cap bilayer 202 includes thermal sink cap layer 202a and nonmagnetic metal cap layer 202b, and seed bilayer 210 includes nonmagnetic metal seed layer 210a and thermal sink seed layer 210b. MR stack 200 is positioned between top shield 24 and bottom shield 28. Nonmagnetic metal cap layer 202b and nonmagnetic metal seed layer 210a are typically included in cap bilayer 202 and seed bilayer 210, respectively, to provide an appropriate shield-to-shield spacing for the read sensor and to protect CPP MR stack 200.

In operation, MR stack 200 flies over the surface of a rotating magnetic disc as a portion of magnetoresistive read/write head 10. As MR stack 200 passes over the disc, flux having varying magnetic field directions is emanated from the disc, representing different states of data that are written to the disc. This is known as bit flux. As the ABS of MR stack 200 confronts flux emanating from the disc, the angle of magnetization between first free layer 204 and second free layer 208 changes depending on the direction of the magnetic field emanating from the disc (that is, depending on the state of data at the ABS of MR stack 200). When the angle of magnetization between the free layers changes, the resistance across the sensor also changes. Sense current I is applied between first free layer 204 and second free layer 208 to detect this change in resistance with the changing magnetic field at the ABS.

As areal bit densities increase, higher demand is placed on the sensitivity of the magnetoresistive portion of the CPP MR stack 200. This in turn results in an increase in the amount of heat that is produced by nonmagnetic layer 206 during operation due to Joule heating. The addition of thermal sink layers 202a and 210b, which are made of a material having high thermal conductivity (preferably greater than ~50 W/m° K), significantly dissipates this heat before it reaches the thermally sensitive sensitive layers in MR stack 200. The decreased temperature at the magnetoresistive element significantly improves the reliability and longevity of the read sensor.

Figure 9:
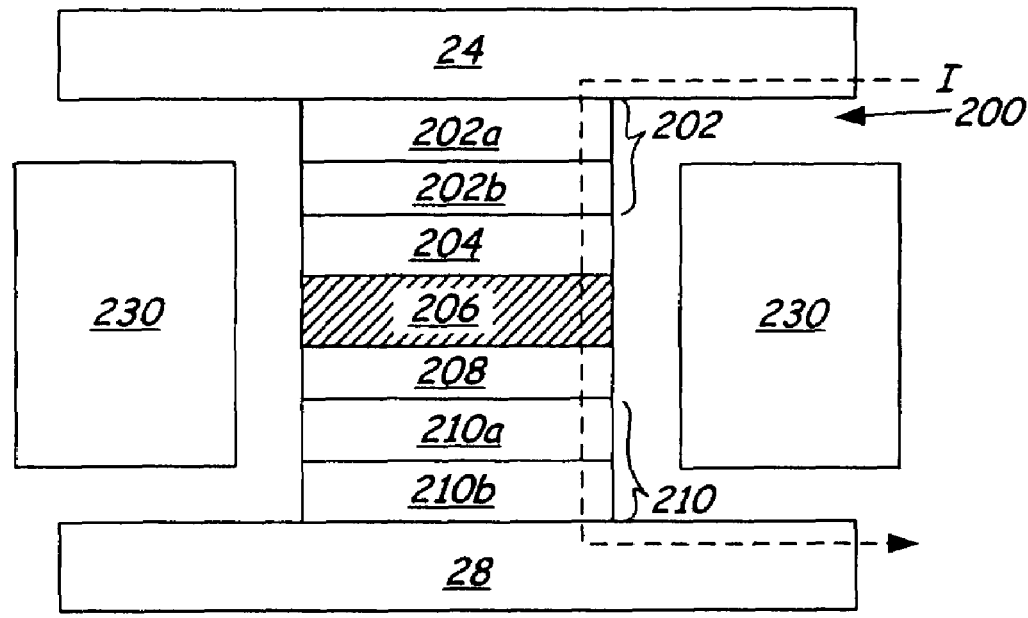
FIG. 9 shows an ABS view of another configuration for a tri-layer CPP MR stack having improved thermal conduction according to the present invention.

FIG. 9 shows an ABS view of a second configuration for tri-layer CPP MR stack 200 having improved thermal conduction according to the present invention. Tri-layer CPP MR stack 200 has all of the same components in-stack as the CPP MR stack shown in FIG. 8. The configuration in FIG. 9 incorporates additional thermal sink layers 230 adjacent to CPP MR stack 200. Thermal sink blocks 230 are located between top shield 24 and bottom shield 28.

Since tri-layer CPP MR stack 200 does not require longitudinal permanent magnet biasing, the space occupied by the permanent magnet layers can be replaced with thermal sink blocks 230. These layers may be made of, but not limited to, Rh, Al, Cu, Mo, W, Au, Cr, Ir, Nb, Pd, Pt, Ru, Ag, or any alloy thereof. Thermal sink blocks 230 preferably have a width of 200 Å to 600 Å, depending on design requirements.

A thin layer of insulation is positioned between CPP MR stack 200 and thermal sink blocks 230, and between shields 24, 28 and thermal sink blocks 230 to avoid shorting the electrically conductive components of the read sensor. Various materials can be used for the thin insulating layer, but preferably the thin insulating layer material has both good electrical insulation and relatively high thermal conductivity. For example, diamond-like-carbon (DLC) possesses both of these properties.

The operation of CPP MR stack 200 shown in FIG. 9 is similar to the operation of that shown in FIG. 8. As areal bit densities increase, higher demand is placed on the sensitivity of the magnetoresistive portion of the CPP MR stack 200. This in turn results in an increase in the amount of heat that is produced by nonmagnetic layer 206 during operation due to Joule heating. The inclusion of thermal sink blocks 230 in addition to thermal sink layers 202a and 210b, all of which are made of a material having high thermal conductivity (preferably greater than ~50 W/m° K), significantly dissipates this heat before it reaches the thermally sensitive layers in MR stack 200. The decreased temperature at the magnetoresistive element significantly improves the reliability and longevity of the read sensor.

Figure 10:
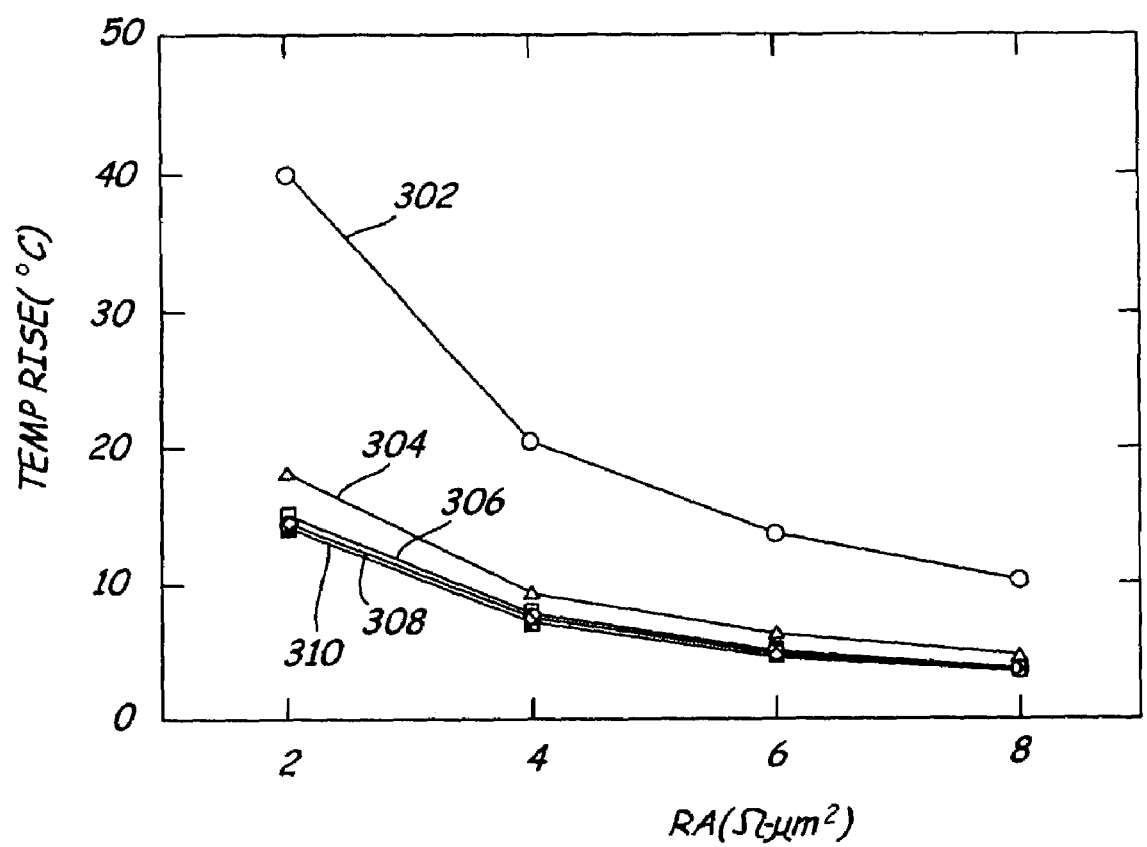
FIG. 10 is a line graph showing temperature rise as a function of the resistance-area (RA) product in a CPP MR stack with various materials used for the cap and seed layers.

FIG. 10 is line graph showing temperature rise as a function of the resistance-area (RA) product in a CPP MR reader with various materials used for the cap and seed layers. FIG. 10 shows the temperature rise in the CPP MR stack in degrees Celsius (° C.) on the vertical axis and the RA product in $\Omega$-$\mu m_2$ on the horizontal axis. The CPP MR reader tested for plotting the graph includes the following layers: a 250 Å thermal sink layer, a 50 Å tantalum cap/seed layer, a 700 Å CPP MR magnetoresistive portion, a 50 Å cap layer, and a 250 Å thermal sink layer. A bias voltage of 140 mV is applied across the stack, and the MR stack has a stripe height of 110nm for a 200 Gb/in. areal density. Although specific dimensions were used for this test, other dimensions and layers may be used in conjunction with the highly thermally conductive thermal sink layers to achieve a reduced operating temperature.

FIG. 10 includes traces 302, 304, 306, 308, and 310, which are traces for a CPP MR reader having thermal sink layers made of Ta, NiFe, Rh, Al, and Cu, respectively. As is shown, Ta, having the lowest thermal conductivity of the five materials, displays a significantly higher temperature rise at all CPP MR stack RA product values. Thus, the use of materials having a high thermal conductivity for the thermal sink layers significantly reduces thermal conduction in the CPP MR stack. This in turn reduces the risk of head degradation due to thermal stresses. Other materials having high thermal conductivity that could also be used for the thermal sink layers to achieve a similar heat dissipation include Mo, W, Au, Cr, Ir, Nb, Pd, Pt, Ru, Ag, and any alloys thereof.

Figure 11A:
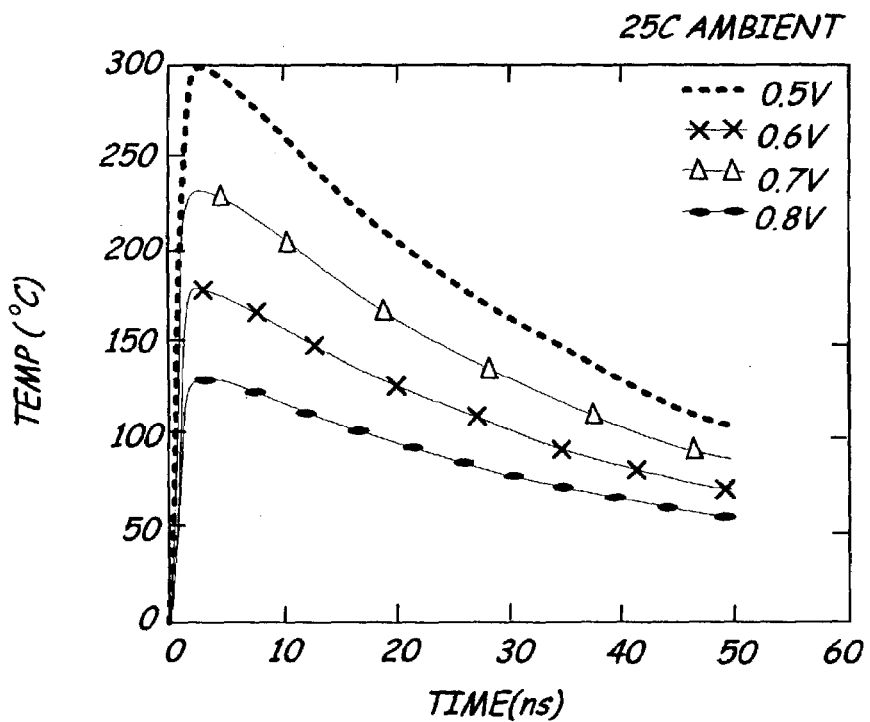
FIG. 11 is a line graph showing the temperature rise due to electrostatic discharge (ESD) current in a conventional CPP MR stack and a CPP MR stack according to the present invention.
Figure 11B:
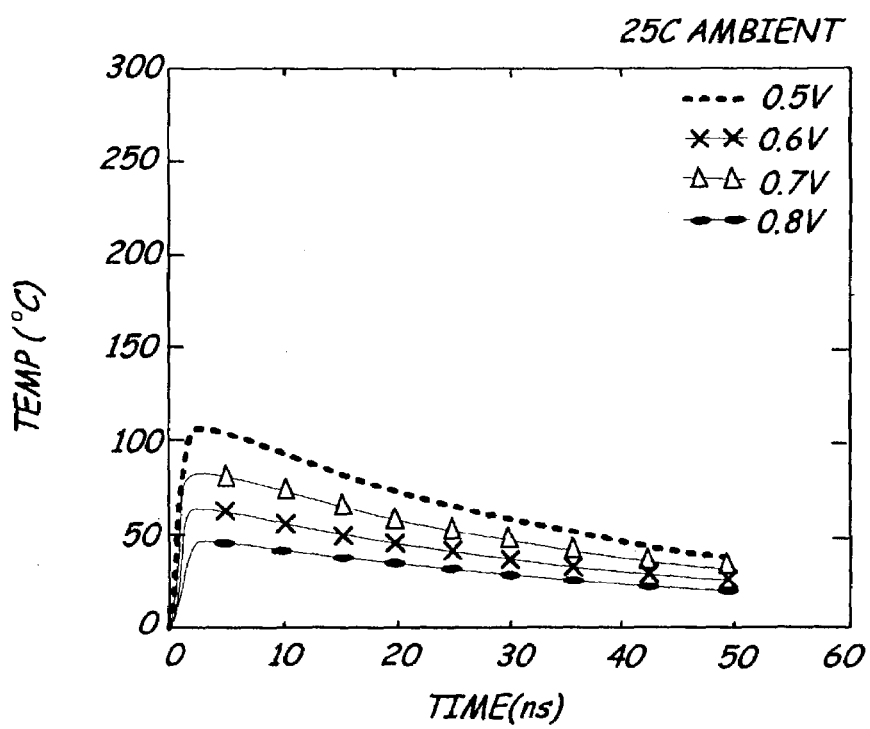

FIG. 11a is a graph showing the temperature rise due to electrostatic discharge (ESD) current at various operating temperatures in a conventional CPP MR stack, and FIG. 11b is a graph showing the temperature rise due to electrostatic discharge (ESD) at various operating temperatures a CPP MR stack according to the present invention. In both FIGS. 11a and 11b, the temperature rise in the CPP MR stack in degrees Celsius (° C.) is shown on the vertical axis and the ESD time in nanoseconds (ns) is shown on the horizontal axis, at an ambient temperature of 25° C.

Electrostatic discharge is the transfer of charge between bodies at different electrical potentials. ESD can change the electrical characteristics of a semiconductor device, degrading or destroying it. ESD also may upset the normal operation of an electronic system, causing equipment malfunction or failure. Further, ESD may result in a momentary but significant temperature increase in the CPP device, putting undesirable thermal stress on the device which may also cause equipment malfunction or failure.

In FIG. 11a, an ESD test on a CPP MR stack including a cap layer made of beta phase Ta (thermal conductivity: ~5 W/m° K) is shown. In FIG. 11b, an ESD test on a CPP MR stack including a cap layer made of Al (thermal conductivity: 237 W/m° K) is shown. As is shown, incorporating a cap layer made of a material having a high thermal conductivity significantly reduces temperature spikes in the CPP device at all operating voltages. In fact, at typical operating voltages the inclusion of a highly thermally conductive material in the CPP MR stack reduces the temperature spike by up to 200° C. This reduction in temperature spikes significantly improves the reliability and durability of the CPP MR reader.

In summary, the present invention is a magnetoresistive (MR) sensor having reduced operating temperature. The MR sensor, which includes an MR stack having a magnetoresistive layer, is configured to operate in a current-perpendicular-to-plane (CPP) mode wherein a sense current flows substantially perpendicular to a longitudinal plane of the magnetoresistive layer. The magnetoresistive layer is preferably a tunnel barrier (for a TMR device) or a nonmagnetic metal (for a GMR device). The MR sensor further includes a thermal sink layer positioned with respect to the MR stack to reduce an operating temperature of the magnetoresistive sensor. The thermal sink layer is made of a material having high thermal conductivity, and is preferably separated from the MR stack by a nonmagnetic metallic cap or seed layer to satisfy processing requirements.

Although the present invention has been described with reference to preferred embodiments, workers skilled in the art will recognize that changes may be made in form and detail without departing from the spirit and scope of the invention. For example, the improved thermal conduction provided by the present invention may be applied to magnetic read/write head employing other types of magnetoresistive sensors, including anisotropic magnetoresistive (AMR) sensors, colossal magnetoresistive (CMR) sensors, and ballistic magnetoresistive (BMR) sensors.

The invention claimed is:

1. A magnetoresistive sensor comprising:
a magnetoresistive (MR) stack having a nonmagnetic layer, the MR stack configured to operate in a current-perpendicular-to-plane (CPP) mode wherein a sense current flows substantially perpendicular to a longitudinal plane of the nonmagnetic layer;
first and second nonmagnetic metal layers respectively positioned on a top surface and a bottom surface of the MR stack;
first and second electrically conductive leads to provide the sense current to the MR stack; and
heat dissipating means, positioned (a) between the first and second electrically conductive leads and (b) at least one of (1) outside of the MR stack and (2) within the MR stack adjacent the nonmagnetic metal layers, to reduce an operating temperature of the magnetoresistive sensor, the heat dissipating means made of a material having a high thermal conductivity.

2. The magnetoresistive sensor of claim 1, wherein the material having high thermal conductivity has a thermal conductivity of at least approximately 50 W/m° K.

3. The magnetoresistive sensor of claim 1, wherein the material having high thermal conductivity is selected from the group consisting of Mo, W, Al, Cu, Au, Rh, Cr, Ir, Nb, Pd, Pt, Ru, Ag, and any alloy thereof.

4. The magnetoresistive sensor of claim 1, wherein the heat dissipating means has a thickness of at least about 250 Å.

5. The magnetoresistive sensor of claim 1, wherein the MR stack is a tri-layer stack including two ferromagnetic free layers separated by the nonmagnetic layer.

6. The magnetoresistive sensor of claim 1, wherein the heat dissipating means comprises thermal sink layers positioned on the first and second nonmagnetic metal layers.

7. The magnetoresistive sensor of claim 1, wherein the MR stack includes a ferromagnetic free layer and a pinned layer separated by the nonmagnetic layer.

8. The magnetoresistive sensor of claim 7, wherein a magnetization of the pinned layer is pinned in a fixed direction by at least one permanent magnet positioned adjacent to the MR stack.

9. The magnetoresistive sensor of claim 1, wherein the heat dissipating means comprises a first thermal sink block positioned adjacent to the MR stack.

10. A magnetoresistive sensor having a reduced operating temperature comprising:
a magnetoresistive (MR) stack having a nonmagnetic layer, the MR stack configured to operate in a current-perpendicular-to-plane (CPP) mode wherein a sense current flows substantially perpendicular to a longitudinal plane of the nonmagnetic layer;
first and second nonmagnetic metal layers respectively positioned on a top surface and a bottom surface of the MR stack;
first and second electrically conductive leads to provide the sense current to the MR stack; and
first and second thermal sink layers respectively positioned on the first and second nonmagnetic metal layers and between the first and second electrically conductive leads, the first and second thermal sink layers made of a material having high thermal conductivity.

11. The magnetoresistive sensor of claim 10, wherein the material having high thermal conductivity has a thermal conductivity of at least approximately 50 W/m° K.

12. The magnetoresistive sensor of claim 10, wherein the material having high thermal conductivity is selected from the group consisting of Mo, W, Al, Cu, Au, Rh, Cr, Ir, Nb, Pd, Pt, Ru, Ag, and any alloy thereof.

13. The magnetoresistive sensor of claim 10, wherein the first and second thermal sink layers have a thickness of at least about 250 Å.

14. The magnetoresistive sensor of claim 10, wherein the MR stack is tri-layer stack including two ferromagnetic free layers separated by the nonmagnetic layer.

15. The magnetoresistive sensor of claim 14, further comprising first and second thermal sink blocks positioned with respect to the nonmagnetic layer outside of the MR stack.

16. The magnetoresistive sensor of claim 15, wherein the first and second thermal sink blocks are insulated from the MR stack by an insulating layer.

17. The magnetoresistive sensor of claim 10, wherein the MR stack includes a ferromagnetic free layer and a pinned layer separated by the nonmagnetic layer.

18. The magnetoresistive sensor of claim 17, wherein a magnetization of the pinned layer is pinned in a fixed direction by at least one permanent magnet positioned adjacent to the MR stack.

19. The magnetoresistive sensor of claim 17, wherein the pinned layer is a synthetic antiferromagnetic (SAF) layer.

20. A current-perpendicular-to-plane (CPP) magnetoresistive (MR) sensor having a reduced operating temperature comprising:
a bottom electrically conductive lead;
a first thermal sink layer made of a material having a high thermal conductivity positioned on the bottom electrically conductive lead;
a first nonmagnetic metal layer positioned on the first thermal sink layer;
a magnetoresistive (MR) stack positioned on the first nonmagnetic metal layer, the MR stack including a magnetoresistive layer and configured to operate in a current-perpendicular-to-plane (CPP) mode wherein a sense current flows substantially perpendicular to a longitudinal plane of the magnetoresistive layer;
a second nonmagnetic metal layer positioned on MR stack;
a second thermal sink layer made of a material having a high thermal conductivity positioned on the second nonmagnetic metal layer; and
a top electrically conductive lead positioned on the MR stack.

21. The magnetoresistive sensor of claim 20, wherein the material having high thermal conductivity has a thermal conductivity of at least approximately 50 W/° K.

22. The magnetoresistive sensor of claim 20, wherein the material having high thermal conductivity is selected from the group consisting of Mo, W, Al, Cu, Au, Rh, Cr, Ir, Nb, Pd, Pt, Ru, Ag, and any alloy thereof.

23. The magnetoresistive sensor of claim 20, wherein the first and second thermal sink layers have a thickness of at least about 250 Å.

24. The magnetoresistive sensor of claim 20, wherein the magnetoresistive layer is a tunnel barrier.

25. The magnetoresistive sensor of claim 20, further comprising first and second thermal sink blocks positioned with respect to the magnetoresistive layer outside of the MR stack.

26. The magnetoresistive sensor of claim 25, wherein the first and second thermal sink blocks have a thickness of about 200 to 600 Å.

27. The magnetoresistive sensor of claim 20, wherein the MR stack comprises a first ferromagnetic free layer, a second ferromagnetic free layer, and the magnetoresistive layer positioned between the first and second free layers.

28. The magnetoresistive sensor of claim 20, wherein the MR stack comprises a ferromagnetic free layer, a pinned layer, and the magnetoresistive layer positioned between the free layer and the pinned layer.

29. The magnetoresistive sensor of claim 28, wherein the pinned layer comprises a synthetic antiferromagnetic (SAF) pinned layer.

30. The magnetoresistive sensor of claim 28, wherein a magnetization of the pinned layer is pinned by two permanent magnets positioned adjacent the MR stack.

31. The magnetoresistive sensor of claim 28, wherein the first thermal sink block has a thickness of about 200 to 600 Å.

32. The magnetoresistive sensor of claim 28, wherein the heat dissipating means further comprises a second thermal sink block positioned adjacent to the MR stack on a side opposite the first thermal sink block.

33. The magnetoresistive sensor of claim 32, wherein the second thermal sink block has a thickness of about 200 to 600 Å.

* * * * *